United States Patent
Morel et al.

(10) Patent No.: US 9,859,178 B2
(45) Date of Patent: Jan. 2, 2018

(54) PACKAGING FOR HIGH-POWER MICROWAVE MODULE

(71) Applicant: BAE SYSTEMS INFORMATION AND ELECTRONIC SYSTEMS INTEGRATION INC., Nashua, NH (US)

(72) Inventors: Yannick C. Morel, Falls Church, VA (US); Sheila J. Konecke, Leesburg, VA (US); Santos Nazario-Camacho, Woodbridge, VA (US); Clint J. Novotny, Washington, DC (US); Keith K. Sturcken, Nokesville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 103 days.

(21) Appl. No.: 14/876,886

(22) Filed: Oct. 7, 2015

(65) Prior Publication Data
US 2016/0100495 A1    Apr. 7, 2016

Related U.S. Application Data

(60) Provisional application No. 62/060,864, filed on Oct. 7, 2014.

(51) Int. Cl.
| | |
|---|---|
| *H05K 5/02* | (2006.01) |
| *H01L 23/04* | (2006.01) |
| *H01L 23/10* | (2006.01) |
| *H01L 21/50* | (2006.01) |

(52) U.S. Cl.
CPC .............. *H01L 23/04* (2013.01); *H01L 21/50* (2013.01); *H01L 23/10* (2013.01); *H01L 2924/0002* (2013.01)

(58) Field of Classification Search
CPC ......... H01L 23/04; H01L 23/10; H01L 21/50; H01L 2924/0002
USPC ........................................................ 361/728
See application file for complete search history.

(56) References Cited

U.S. PATENT DOCUMENTS

| | | | | |
|---|---|---|---|---|
| 5,289,002 A | * | 2/1994 | Tarn .................... | H01L 31/0203 250/239 |
| 6,369,380 B1 | * | 4/2002 | Hirai ..................... | G03B 7/099 250/226 |
| 7,626,338 B2 | * | 12/2009 | Kato .................... | F21S 48/328 315/118 |

(Continued)

*Primary Examiner* — Tuan T Dinh
*Assistant Examiner* — Rockshana Chowdhury
(74) *Attorney, Agent, or Firm* — Antony P. Ng; Russell Ng PLLC; Scott J. Asmus

(57) ABSTRACT

A microwave module is described. The microwave module includes a base bracket, a window plate and a lid. The base bracket is configured to contain a photoconductive switch, a radio-frequency transformer and dielectric oil. The window plate, which is transparent to optical light, covers a first portion of the base bracket in which the photoconductive switch is located. The window plate is sealed to the base bracket. The lid, which includes a cutout to allow the radio-frequency transformer to pass through the lid, covers a second portion of the base bracket in which the radio-frequency transformer is located. The window plate is sealed to the base bracket, and the lid is sealed to the window plate, the base bracket and the radio-frequency transformer to contain the dielectric oil within the microwave module.

7 Claims, 5 Drawing Sheets

(56) References Cited

U.S. PATENT DOCUMENTS

| | | | |
|---|---|---|---|
| 2012/0098607 A1* | 4/2012 | Tatoian | F41H 13/0068 331/96 |
| 2013/0118010 A1* | 5/2013 | Boesch | H05K 9/0056 29/841 |
| 2014/0262129 A1* | 9/2014 | Li | G01R 31/2874 165/11.1 |

* cited by examiner

PACKAGING FOR HIGH-POWER MICROWAVE MODULE

PRIORITY CLAIM

The present application claims priority under 35 U.S.C. §119(e)(1) to provisional application No. 62/060,864, filed on Oct. 7, 2014, the contents of which are incorporated herein by reference.

STATEMENT OF GOVERNMENT INTEREST

The present invention was made with United States Government assistance under Contract No. 13-C-0007 awarded by classified customer. The United States Government has certain rights in the present invention.

BACKGROUND OF THE INVENTION

1. Technical Field

The present invention relates to electronic device packaging in general, and in particular to a package for high-power microwaves modules.

2. Description of Related Art

Many high-power microwave modules are designed for high-voltage operations, such as 5 kV or more. At such high voltages, certain parts of the microwave modules, such as photoconductive switches and the lower section of radio-frequency (RF) transformers, are exposed to very high electric field. Because photoconductive switches and the lower section of RF transformers are prone to electrical breakdowns caused by excessive exposure to high electric field, microwave modules will not operate reliably at more than 2 kV, which seriously hamper their usefulness.

Consequently, it would be desirable to provide an improved package for a microwave module that allows for reliable high-voltage operations.

SUMMARY OF THE INVENTION

In accordance with a preferred embodiment of the present invention, a microwave module includes a base bracket, a window plate and a lid. The base bracket is configured to contain a photoconductive switch, a radio-frequency transformer and dielectric oil. The window plate, which is transparent to optical light, covers a first portion of the base bracket in which the photoconductive switch is located. The window plate is sealed to the base bracket. The lid, which includes a cutout to allow the radio-frequency transformer to pass through the lid, covers a second portion of the base bracket in which the radio-frequency transformer is located. The window plate is sealed to the base bracket, and the lid is sealed to the window plate, the base bracket and the radio-frequency transformer to contain the dielectric oil within the microwave module.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
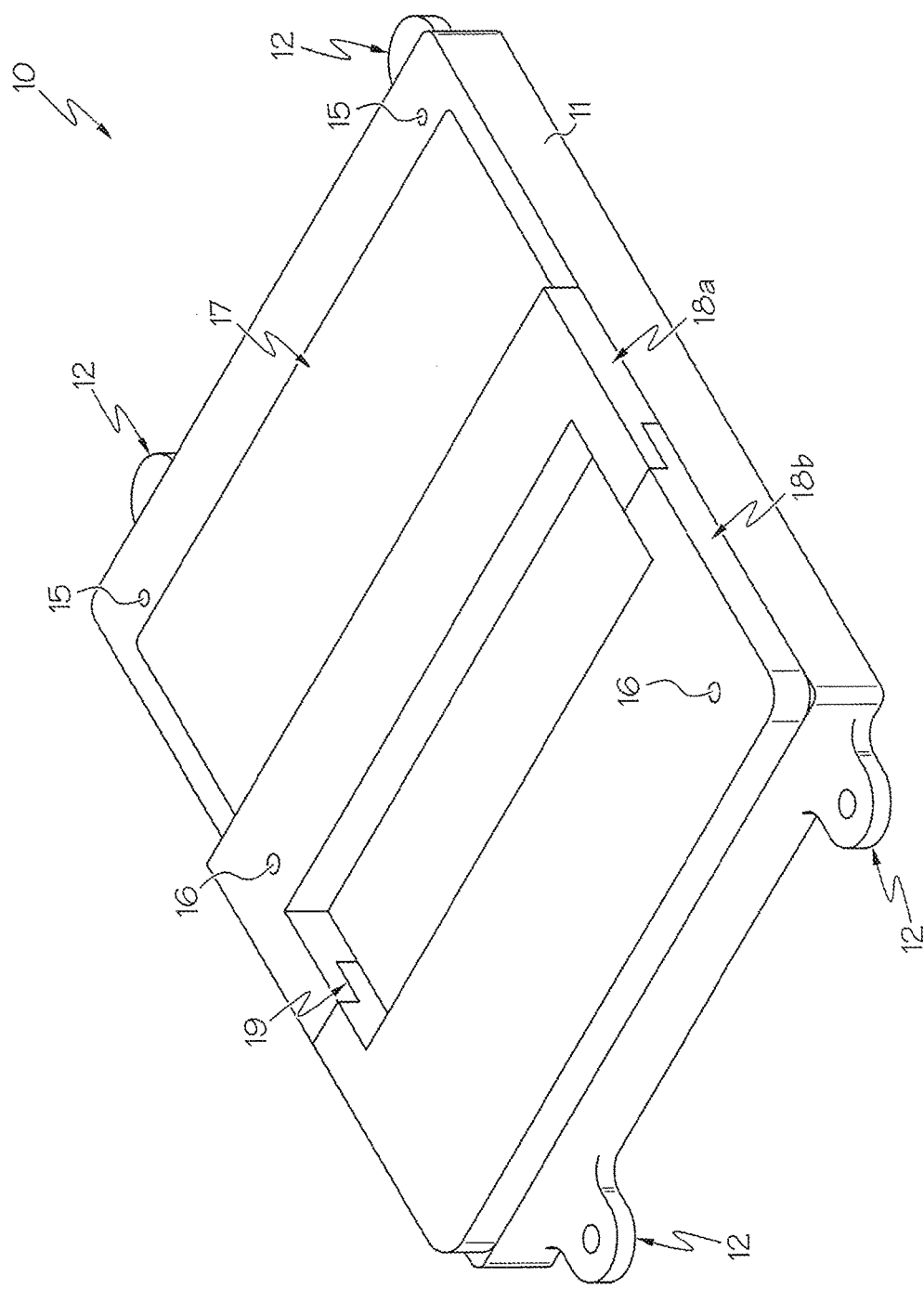
FIG. 1 is an isometric view of a package for a high-power microwave module, in accordance with a preferred embodiment of the present invention.

Referring now to the drawings and in particular to FIG. 1, there is illustrated an isometric view of a package for a high-power microwave module, in accordance with a preferred embodiment of the present invention. As shown, a package 10 includes a base bracket 11 having a set of mounting tabs 12, a thin window plate 17, a lid 18 made of parts 18a-18b. Alternatively, lid 18 can be formed as one solid piece instead of two separate parts 18a-18b. Lid 18 includes a cutout 19 and fill holes 16. Base bracket 11 also includes fill holes 15.

Base bracket 11, which is preferably made of aluminum, includes a bottom. The size of base bracket 11 is configured to contain a photoconductive switch and a radio-frequency (RF) transformer. The height of base bracket 11 is configured to provide a suitable mount for window plate 17 that can enclose the photoconductive switch as well as the first and second layer of the RF transformer. Window plate 17 is approximately 0.040" thick, and is preferably made of clear polycarbonate, clear plastic, glass or other material that is transparent to optical light. Lid 18 is approximately 0.25" thick, and is preferably made of polycarbonate that will not deform under pressure.

Figure 2A:
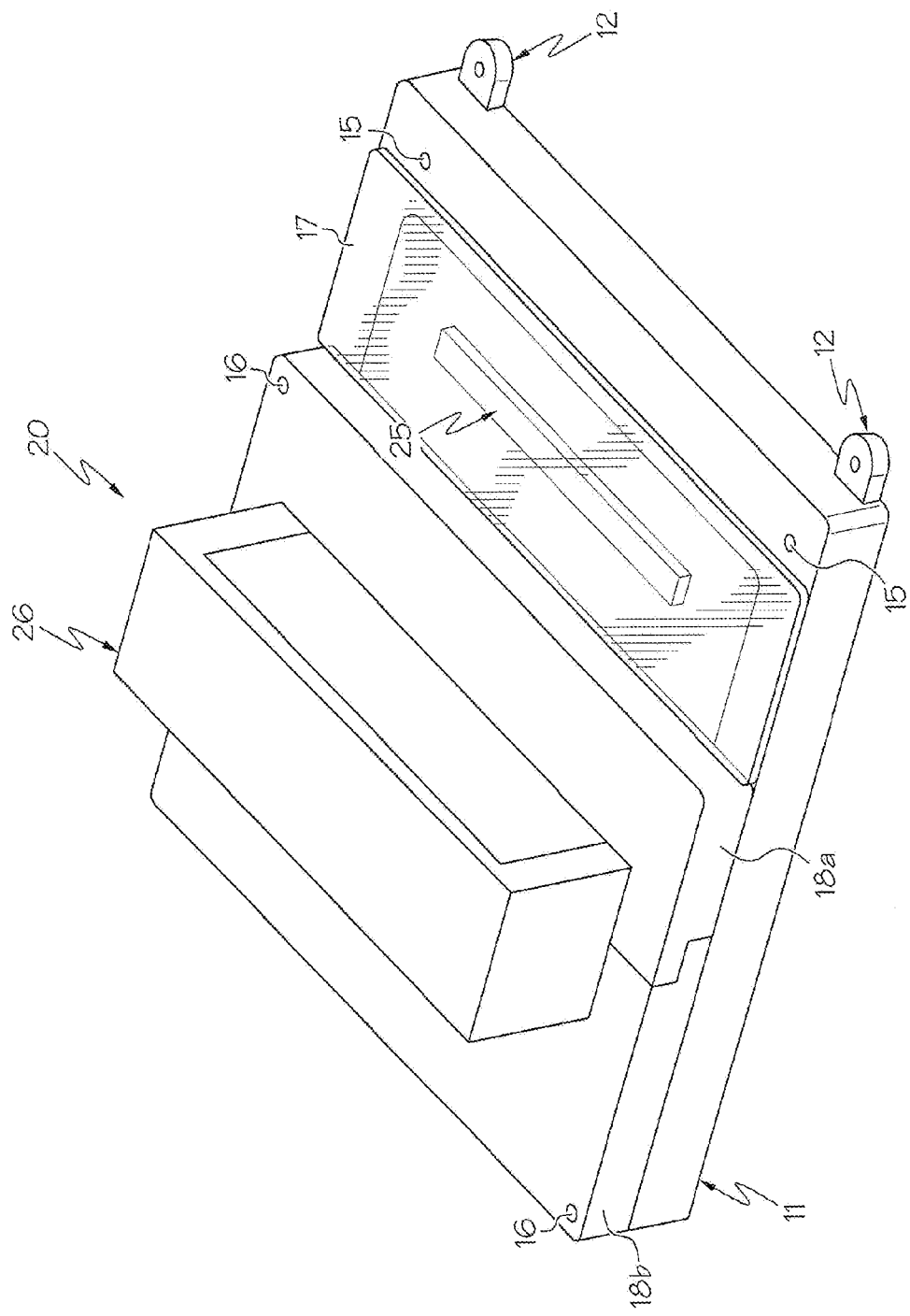
FIGS. 2A and 2B show an isometric view and a cross-section side view of a high-power microwave module, respectively, using the package from FIG. 1, in accordance with a preferred embodiment of the present invention.
Figure 2B:
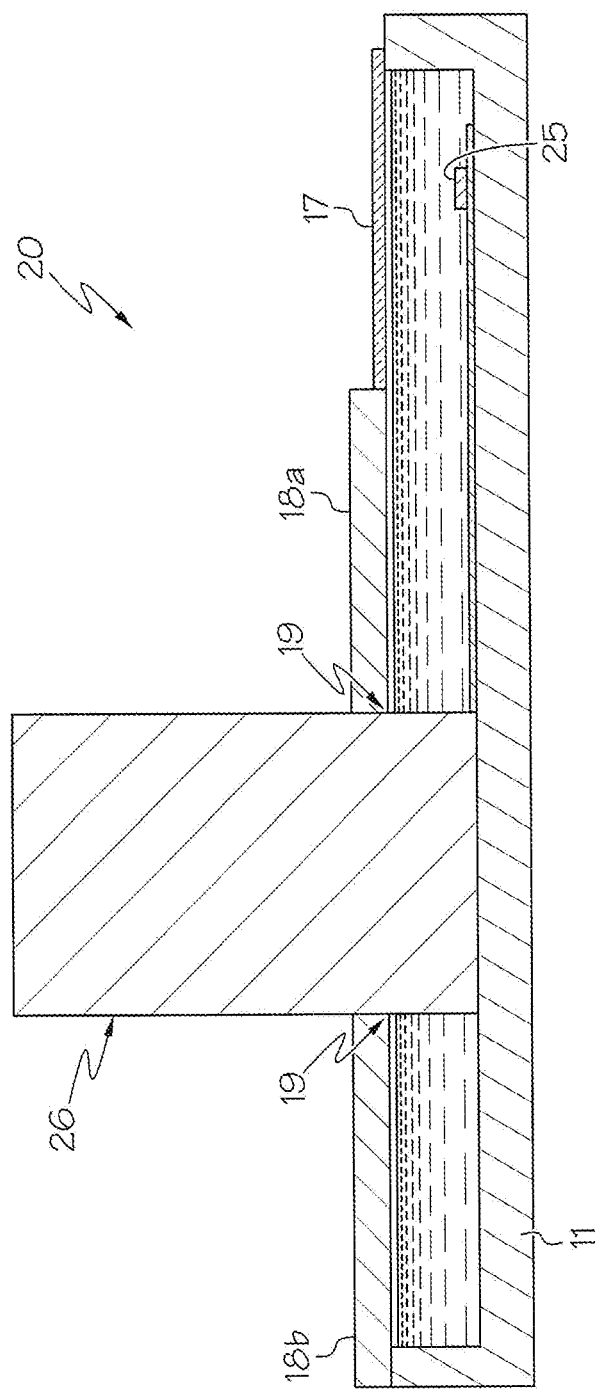

With reference now to FIGS. 2A-2B, there are illustrated an isometric view and a cross-section side view of a high-power microwave module, respectively, using package 10 from FIG. 1, in accordance with a preferred embodiment of the present invention. As shown, a microwave module 20 includes a photoconductive switch 25 located underneath window plate 17 and a RF transformer 26 located within cutout 19. Photoconductive switch 25 and the first and second layer of RF transformer 26 are considered as the weak points of microwave module 20 because they are prone to electrical breakdown caused by their excessive exposure to the highest amount of electric field.

Submersing photoconductive switch 25 and the first and second layer of RF transformer 26 in dielectric oil can protect photoconductive switch 25 and the first and second layer of RF transformer 26 from electric field. Dielectric oil, preferably made of Fluorinert FC-70, can be added to microwave module 20 via fill holes 15 in base bracket 11. Dielectric oil can also be added to microwave module 20 via fill holes 16 in lid 18. Window plate 17 protects photoconductive switch 25 from dust and debris and keeps dielectric oil contained within base bracket 11.

Cutout 19 enables the upper section of RF transformer 26 to stick out of lid 18. This will allow an antenna to be attached to and removed from microwave module 20 without having to break open window plate 17 and/or lid 18. An epoxy seal, such as aluminum nitride, is provided around the edges of cutout 19 as a seal between lid 18 and RF transform 26.

Figure 3:
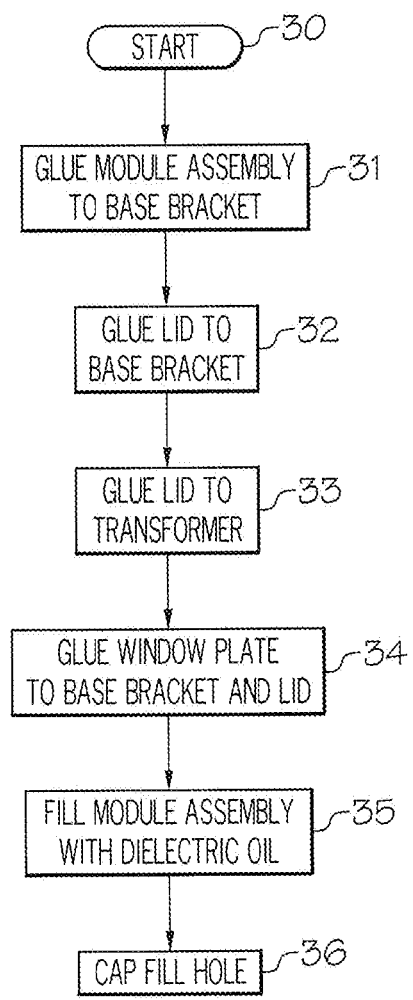
FIG. 3 depicts a method for constructing a microwave module using the package from FIG. 1, in accordance with a preferred embodiment of the present invention.

Referring now to FIG. 3, there is illustrated a method for constructing a module assembly process, in accordance with a preferred embodiment of the present invention. Starting at block 30, a module assembly having a photoconductive switch and a RF transformer is glued on a base bracket, such as base bracket 11 from FIG. 1, as shown in block 31. A lid, such as lid 18 from FIG. 1, is glued and sealed on the base bracket, as depicted in block 32. The lid is sealed all around an upper section of the RF transformer, as shown in block 33. A window plate, such as window plate 17 from FIG. 1, is glued and sealed on the base bracket and the lid, as depicted in block 34. The module is then filled with dielectric oil via the fill holes in the lid and the base bracket, as shown in block 35. The fill holes are subsequently sealed or capped, as depicted in block 36.

Figure 4A:
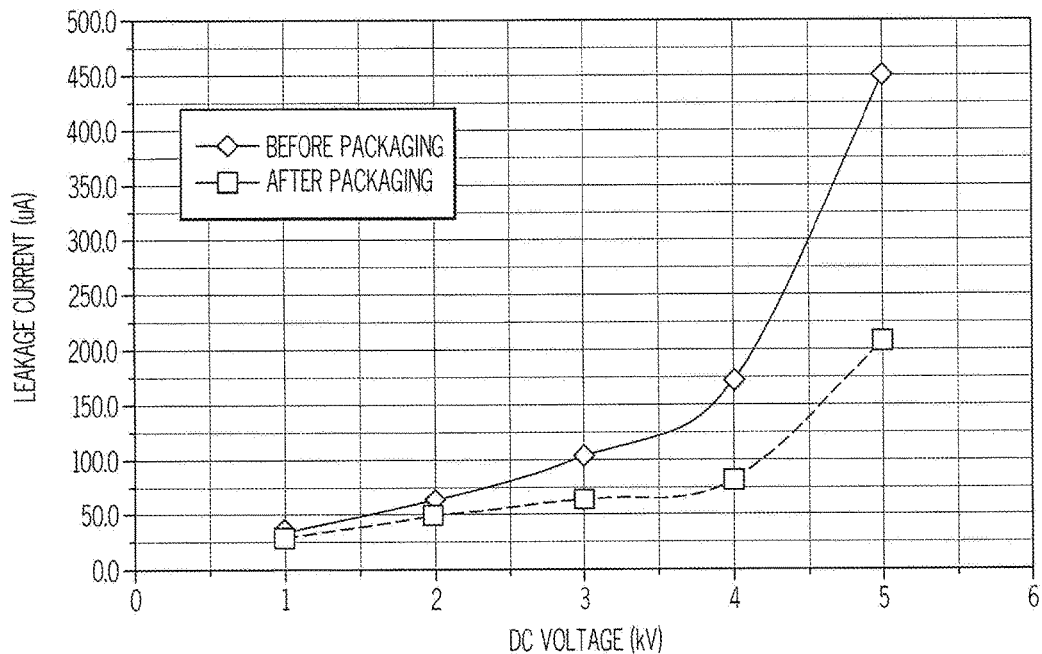
FIGS. 4A-4B are graphs showing the Hipot test results before and after using the package from FIG. 1.
Figure 4B:
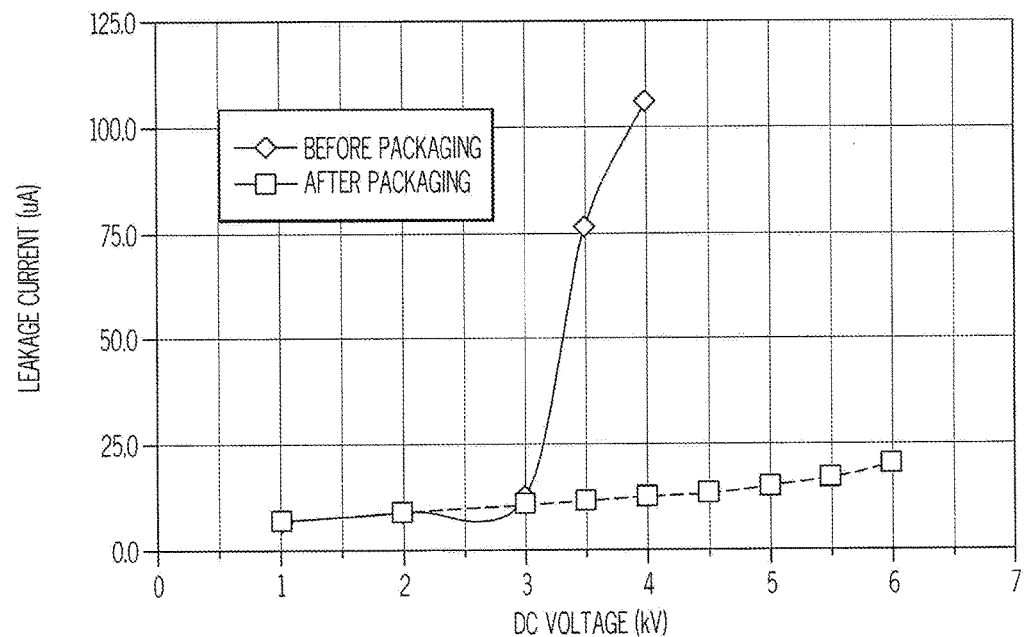

Hipot tests were conducted to determine the electrical characteristics of two packaged microwave modules. FIG. 4A shows the performance of a microwave module having a lid formed by a single piece (first embodiment). FIG. 4B shows the performance of a microwave module having a lid formed by two parts, such as parts 18a-18b in FIG. 1 (second embodiment). Both embodiments show similar or better performances after the microwave modules have been packaged compared to its previous state, proving that the packaging of the present invention has no influence on the performances of the microwave modules.

In addition, the second embodiment exhibits superior performance compared to the first embodiment, and no leaks have been noticed after handling the microwave modules. Antennas have been attached to the upper section of their respective RE transformers and the RF emission of the two microwave modules has been tested in a fully functional manner, i.e., with light. The RE emission of the microwave modules is comparable to that of "unpackaged" microwave modules operated in the same way. No significant amplitude or spectrum changes were observed and both microwave modules have been operated up to 5 kV.

As has been described, the present invention provides an improved packaging for high-power microwaves modules. The improved packaged modules can significantly increase the reliability of the array especially for high-voltage operations and provide environmental protection for photoconductive switches against dust or other contaminants.

While the invention has been particularly shown and described with reference to a preferred embodiment, it will be understood by those skilled in the art that various changes in form and detail may be made therein without departing from the spirit and scope of the invention.

What is claimed is:

1. A microwave module comprising:
   a base bracket having a base plate and a plurality of side walls for containing a photoconductive switch, a radio-frequency transformer and dielectric oil;
   a window plate for covering a first portion of said base bracket at which said photoconductive switch is located, wherein said window plate is sealed to at least one of said side walls of said base bracket, wherein said window plate is transparent to optical light; and
   a lid for covering a second portion of said base bracket at which said radio-frequency transformer is located, wherein said lid includes a cutout to allow said radio-frequency transformer to pass through said lid, wherein said lid is sealed to said window plate, at least one of said side walls of said base bracket and said radio-frequency transformer in order to contain said dielectric oil within said microwave module.

2. The microwave module of claim 1, wherein said base bracket is made of aluminum.

3. The microwave module of claim 1, wherein said base bracket includes four side walls.

4. The microwave module of claim 1, wherein said window plate is made of clear polycarbonate.

5. The microwave module of claim 1, wherein said window plate is made of clear plastic.

6. The microwave module of claim 1, wherein said window plate is made of glass.

7. The microwave module of claim 1, wherein dielectric oil is made of Fluorinert FC-70.

* * * * *